(12) United States Patent
Park et al.

(10) Patent No.: US 9,076,886 B2
(45) Date of Patent: Jul. 7, 2015

(54) SEMICONDUCTOR DEVICE

(71) Applicant: Samsung Electronics Co., Ltd., Suwon-si (KR)

(72) Inventors: Dong-Il Park, Hwaseong-si (KR); Ae-Gyeong Kim, Ansan-si (KR); Jong-Sam Kim, Seongnam-si (KR); Kyoung-Eun Uhm, Incheon (KR); Tae-Cheol Lee, Yongin-si (KR); Yong-Sang Jeong, Hwaseong-si (KR); Jin-Ha Jeong, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 13/960,323

(22) Filed: Aug. 6, 2013

(65) Prior Publication Data
US 2014/0042528 A1   Feb. 13, 2014

(30) Foreign Application Priority Data
Aug. 7, 2012   (KR) .......................... 10-2012-0086322

(51) Int. Cl.
| H01L 29/66 | (2006.01) |
| H01L 21/8234 | (2006.01) |
| H01L 29/423 | (2006.01) |
| H01L 29/40 | (2006.01) |
| H01L 29/78 | (2006.01) |

(52) U.S. Cl.
CPC .... H01L 21/823468 (2013.01); H01L 29/4236 (2013.01); H01L 29/401 (2013.01); H01L 21/823456 (2013.01); H01L 29/7834 (2013.01)

(58) Field of Classification Search
CPC ............... H01L 21/823456; H01L 21/823462; H01L 29/401; H01L 29/4236; H01L 29/7834
USPC .................................. 257/330, 333; 438/589
See application file for complete search history.

(56) References Cited

U.S. PATENT DOCUMENTS

| 6,476,444 | B1 | 11/2002 | Min |
| 7,883,965 | B2 | 2/2011 | Choi et al. |
| 7,923,331 | B2* | 4/2011 | Han et al. ...................... 438/270 |
| 8,106,450 | B2 | 1/2012 | Baek |
| 2006/0113590 | A1 | 6/2006 | Kim et al. |
| 2009/0298271 | A1 | 12/2009 | Kim et al. |
| 2009/0315092 | A1 | 12/2009 | Mikasa |
| 2011/0278662 | A1 | 11/2011 | Park et al. |
| 2012/0001258 | A1* | 1/2012 | Kim ............................. 257/330 |

FOREIGN PATENT DOCUMENTS

| KR | 1020060062326 A | 6/2006 |
| KR | 100855857 B1 | 8/2008 |
| KR | 1020100132197 A | 12/2010 |

* cited by examiner

*Primary Examiner* — Jerome Jackson, Jr.
*Assistant Examiner* — Mohammed R Alam
(74) *Attorney, Agent, or Firm* — Myers Bigel Sibley & Sajovec, P.A.

(57) ABSTRACT

A semiconductor device and a method for fabricating the same are provided. The semiconductor device includes a device isolation region, a trench formed in the device isolation region, a void connected to the trench in the device isolation region, a first mask pattern formed along sidewalls of the trench and protruding inwardly with respect to the void, a gate insulating film formed along the sidewall of the void, and a gate electrode filling the trench and at least a portion of the void.

10 Claims, 10 Drawing Sheets

SEMICONDUCTOR DEVICE

CROSS-REFERENCE TO RELATED APPLICATION

This application claims priority under 35 U.S.C. §119 to Korean Patent Application No. 10-2012-0086322 filed on Aug. 7, 2012 in the Korean Intellectual Property Office, the disclosure of which is hereby incorporated by reference in its entirety.

FIELD

Embodiments of the present invention relate to a semiconductor device and a method for fabricating the same.

BACKGROUND

Along with the trends toward high performance, high speed, low power consumption and high integration semiconductor devices, a recess channel transistor has been proposed to improve characteristics of a transistor.

In an attempt to overcome a reduction in the channel length due to shrinkage of device, the recess channel transistor may be configured to secure a sufficiently large channel length by forming a recess trench in a potential region of a transistor channel. In particular, since a high voltage transistor should withstand a high voltage characteristic, advantageous electrical characteristics of the high voltage transistor can be maintained by adopting a recess channel transistor providing a relatively large channel length even in a case where a width of a high-voltage gate is reduced.

In fabricating a high-voltage transistor and a low-voltage transistor using a single process, an insulating film for a high voltage is formed in a recess trench of the high-voltage transistor, and an insulating film for a low voltage is additionally formed in the low-voltage transistor. However, in this case, stress may be applied to an active region of the low-voltage transistor.

SUMMARY

Embodiments, of the present invention provide a semiconductor device and a method for fabricating the same, which can reduce stress generated in an active region of a low-voltage transistor in a process of forming an insulating film for a high voltage.

According to some embodiments of the present invention, a semiconductor device may include a device isolation region, a trench formed in the device isolation region, a void, such as, for example, a ball, connected to the trench in the device isolation region, a first mask pattern formed along sidewalls of the trench and protruding inwardly with respect to the void, a gate insulating film formed along the sidewall of the void, and a gate electrode filling the trench and at least a portion of the void.

According to other embodiments of the present invention, a semiconductor device may include forming a device isolation region, forming a trench in the device isolation region, forming a first mask pattern along sidewalls of the trench, forming a void connected to the trench in the device isolation region such that the first mask pattern protrude inward the void, forming a gate insulating film along sidewalls of the void, and forming a gate electrode filling at least portions of the trench and the void.

According to some embodiments of the present invention, a method for fabricating a semiconductor device may include forming a first transistor in a first region of a substrate, and forming a second transistor in a second region of the substrate, wherein the forming of the first transistor includes forming a device isolation region in the first region, forming a trench in the device isolation region, forming a first mask pattern along sidewalls of the trench, and forming a void connected to the trench in the device isolation region, wherein the first mask pattern is formed to protrude inwardly with respect to the void, a first gate insulating film is formed along sidewalls of the void, and a first gate electrode filling at least portions of the trench and the void, and the forming of the second transistor comprises forming a second gate insulating film on a top surface of the second region, and a second gate electrode is formed on the second gate insulating film.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION

Figure 1:
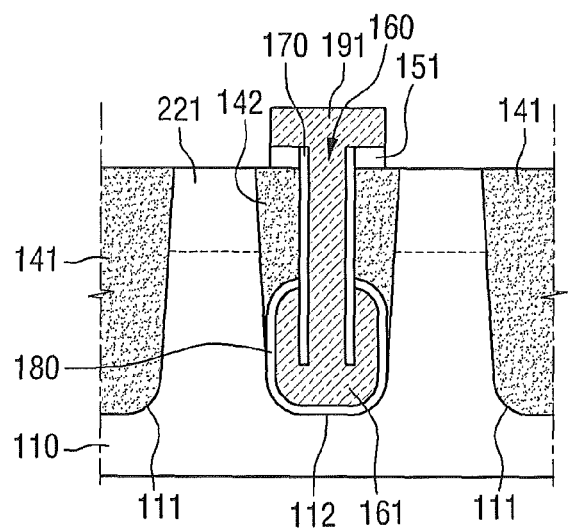
FIG. 1 is a cross-sectional view schematically illustrating a semiconductor device according to various embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

FIGS. 1 to 15 are cross-sectional views schematically illustrating a semiconductor device and methods of fabricating the device according to various embodiments of the present invention.

Referring to FIG. 1, the semiconductor device 1 may include device isolation regions 141 and 142 formed on a substrate 110. The device isolation regions 141 and 142 include first device isolation regions 141, and second device isolation region 142 having a recess trench 160 formed between a pair of first device isolation regions 141.

The substrate 110 may include, for example, a substrate made of at least one semiconductor material selected from the group consisting of Si, Ge, SiGe, GaP, GaAs, SiC, SiGeC, InAs and InP, a rigid substrate such as a Silicon On Insulator (SOI) substrate, a quartz substrate, or a glass substrate for a display, and a flexible plastic substrate made of polyimide, polyethylene terephthalate (PET), polyethylene naphthalate (PEN), polymethyl methacrylate (PMMA), polycarbonate (PC), polyethersulfone (PES), and polyester.

Figure 5:
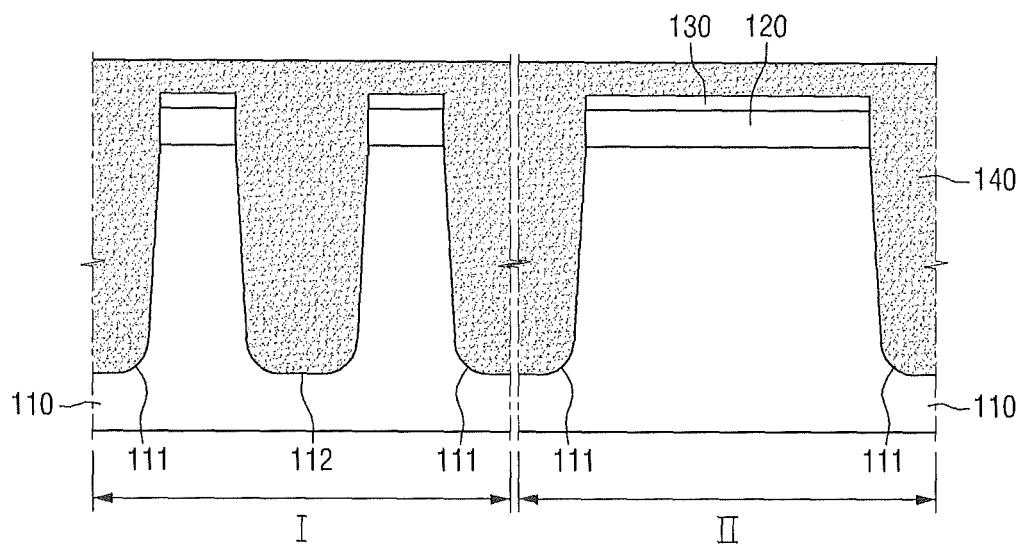

The first device isolation region 141 may be formed by filling an insulating layer 140 in a trench 111, and a second device isolation region 142 may be formed by filling an insulating layer 140 in a trench 112 for a second device isolation region, as shown in FIG. 5. The insulating layer 140 may include, for example, a shallow trench isolation (STI) oxide or a field oxide (FOX).

A recess trench 160 is formed in the second device isolation region 142. A width of the recess trench 160 is smaller than that of the second device isolation region 142.

In addition, a recess void, such as recess ball 161, connected to a recess trench 160 is formed in the second device isolation region 142. The recess ball 161 is formed to penetrate the second device isolation region 142. A width of the recess ball 161 is greater than that of the recess trench 160. Although recess ball 161 is described in various embodiments for purposes of explanation, the recess void is not limited to a ball shape.

An overall depth of the recess trench 160 and the recess ball 161 is equal to a depth of the second device isolation region 142. Here, the concept of "equal" encompasses "substantially equal" and is referred to as being equal within a range of processing tolerance.

The third mask pattern 170 is formed along sidewalls of the recess trench 160. The third mask pattern 170 may be formed to protrude inward with respect to the recess ball 161. Here, it is understood that when the third mask pattern 170 is referred to as protruding inwardly with respect to the recess ball 161, a bottom portion of the third mask pattern 170 is formed to extend lower than a boundary between the recess trench 160 and the recess ball 161. A depth of the third mask pattern 170 may be adjusted on the basis of a top surface of the second device isolation region 142 in consideration of electrical characteristics of a recess channel transistor. The third mask pattern 170 may include a material having high etch selectivity with respect to the second device isolation region 142, for example, at least one nitride selected from the group consisting of SiN, SiON, TaN and TiN.

The second mask pattern 151 is formed on the top surface of the second device isolation region 142. One sidewall of the second mask pattern 151 is formed on the same line with the sidewall of the recess trench 160 and is connected to the upper sidewall of the third mask pattern 170. The second mask pattern 151 may include a material having high etch selectivity with respect to the second device isolation region 142, for example, at least one nitride selected from the group consisting of SiN, SiON, TaN and TiN.

The first gate insulating film 180 is formed along sidewalls of the recess ball 161. The first gate insulating film 180 may also be formed on the bottom surface of the recess ball 161. The first gate insulating film 180 may include, for example, a silicon oxide film, SiON, $Ge_xO_yN_z$, $Ge_xSi_yO_z$, a high-k insulation film, and a combination thereof or a stacked film having these materials sequentially stacked. Examples of the high-k insulation film may include $HfO_2$, $ZrO_2$, $Al_2O_3$, $Ta_2O_5$, hafnium silicate, zirconium silicate, and combinations thereof.

The first gate electrode 191 is formed by filling at least portions of the recess trench 160 and the recess ball 161 with a first conductive layer 190. The first conductive layer 190 may be made of, for example, polysilicon, or may be formed by stacking polysilicon, tungsten (W) and a metal. P- or N-type impurity may be doped into polysilicon. For example, boron (B), a boron compound (BF2) or indium (In) may be used as the P-type impurity, and phosphorus (P) or arsenic (As) may be used as the N-type impurity. The first gate electrode 191 is formed on the second mask pattern 151, the third mask pattern 170 and the first gate insulating film 180. A sidewall profile of the first gate electrode 191 is connected to the other sidewall profile of the second mask pattern 151.

An impurity region 221 is positioned at either side of the first gate electrode 191 on the substrate 110. When the impurity region 221 formed at one side of the first gate electrode 191 is defined as a source region, the impurity region 221 formed at the other side of the first gate electrode 191 may be defined as a drain region. The bottommost portion of the impurity region 221 may be positioned above the boundary of the first gate insulating film 180. A distance between the bottommost portion of the impurity region 221 and the boundary of the first gate insulating film 180 may be adjusted in consideration of electrical characteristics of a recess channel transistor.

Figure 2:
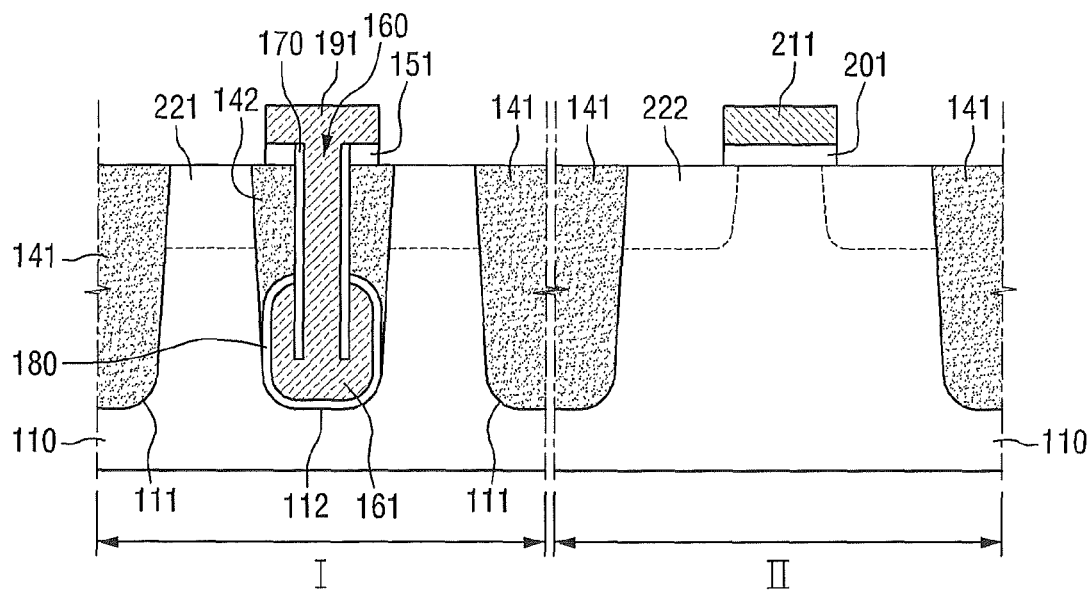
FIG. 2 is a cross-sectional view schematically illustrating a semiconductor device according to various embodiments of the present invention.

FIG. 2 is a cross-sectional view schematically illustrating a semiconductor device according to other embodiments of the present invention. For the sake of convenient explanation, the following description describes differences between the semiconductor devices shown in FIGS. 1 and 2.

Referring to FIG. 2, the semiconductor device 2 according to the second embodiment of the present invention includes a first device isolation region 141 formed to define a first region I and a second region II on the substrate 110. A first transistor is positioned in the first region I, and a second transistor is positioned in the second region II. The first transistor is a high-voltage transistor, for example, a recess channel transistor, and the second transistor is a low-voltage transistor, for example, a planar channel transistor. A second device isolation region 142 is formed between a pair of first device isolation regions 141 in the first region I.

The first transistor positioned in the first region I is formed in the same manner as the semiconductor device 1 shown in FIG. 1.

The second transistor positioned in the second region II includes a second gate insulating film 201 and a second gate electrode 211.

The second gate insulating film 201 is formed on a top surface of the second region II. The second gate insulating film 201 may include, for example, a silicon oxide film, SiON, GexOyNz, GexSiyOz, a high-k insulation film, and a combination thereof or a stacked film having these materials sequentially stacked. Examples of the high-k insulation film may include HfO2, ZrO2, Al2O3, Ta2O5, hafnium silicate, zirconium silicate, and combinations thereof. The second gate insulating film 201 may have a thickness of, for example, 70 Å.

The second gate electrode 211 is not recessed into the substrate 110 but is formed on the second gate insulating film 201 as a second conductive layer 210. The second conductive layer 210 may be made of, for example, polysilicon, or may be formed by stacking polysilicon, tungsten (W) and a metal. P- or N-type impurity may be doped into polysilicon. For example, boron (B), a boron compound (BF2) or indium (In) may be used as the P-type impurity, and phosphorus (P) or arsenic (As) may be used as the N-type impurity. A sidewall profile of the second gate electrode 211 is connected to the other sidewall profile of the second gate insulating film 201.

An impurity region 222 is positioned at either side of the second gate electrode 211 in second region II of the substrate 110. When the impurity region 222 formed at one side of the second gate electrode 211 is defined as a source region, the impurity region 222 formed at the other side of the second gate electrode 211 may be defined as a drain region. A depth of the impurity region 222 may be adjusted in consideration of electrical characteristics of the planar channel transistor.

Hereinafter, a method for fabricating the semiconductor device according to some embodiments of the present invention will be described with reference to FIGS. 3 to 15. Since the semiconductor device according to some embodiments may be fabricated in substantially the same manner as the first transistor positioned in the first region of the semiconductor device according to other embodiments, a detailed description thereof will be omitted.

FIGS. 3 to 15 are cross-sectional views schematically illustrating a method for fabricating the semiconductor device shown in FIG. 2.

Figure 3:
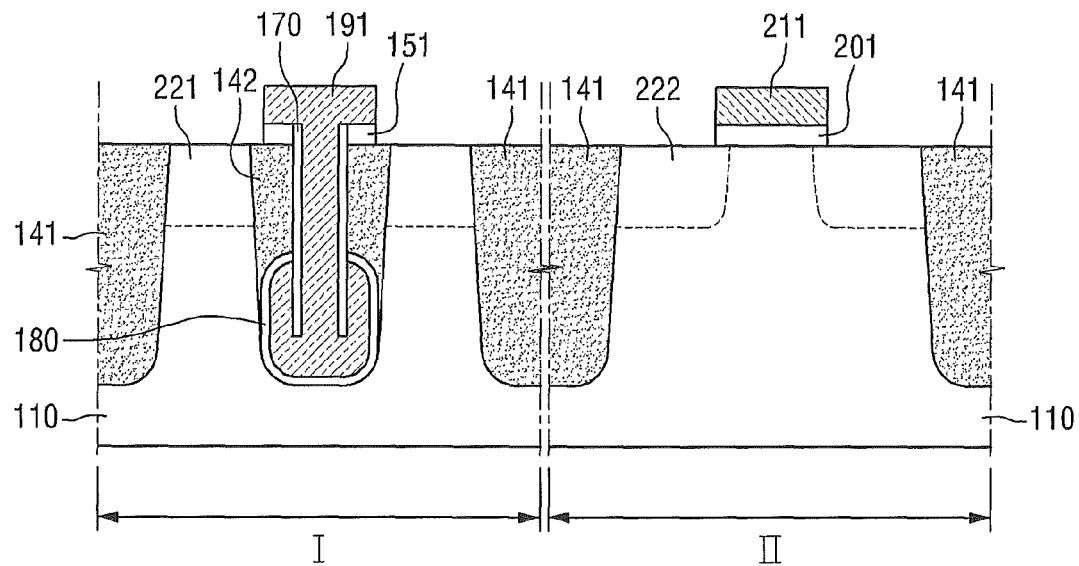
FIGS. 3 to 15 are cross-sectional views schematically illustrating a method for fabricating the semiconductor device shown in FIG. 2 according to various embodiments.

Referring to FIG. 3, a substrate 110 is prepared. As described above, the substrate 110 may include, for example, a substrate made of at least one semiconductor material selected from the group consisting of Si, Ge, SiGe, GaP, GaAs, SiC, SiGeC, InAs and InP, a rigid substrate such as a Silicon On Insulator (SOI) substrate, a quartz substrate, or a glass substrate for a display, and a flexible plastic substrate made of polyimide, polyethylene terephthalate (PET), polyethylene naphthalate (PEN), polymethyl methacrylate (PMMA), polycarbonate (PC), polyethersulfone (PES), and polyester.

Next, a first mask film 120 and a reflection preventing film 130 are sequentially formed on the substrate 110. The first mask film 120 may be formed using, for example, at least one nitride selected from the group consisting of SiN, SiON, TaN and TiN. For example, the reflection preventing film 130 may be formed of an organic or inorganic reflection preventing film. The first mask film 120 and the reflection preventing film 130 may be formed by, for example, chemical vapor deposition (CVD), plasma enhanced chemical vapor deposition (PECVD), physical vapor deposition (PVD), atomic layer deposition (ALD), plasma enhanced atomic layer deposition (PEALD), and so on.

Figure 4:
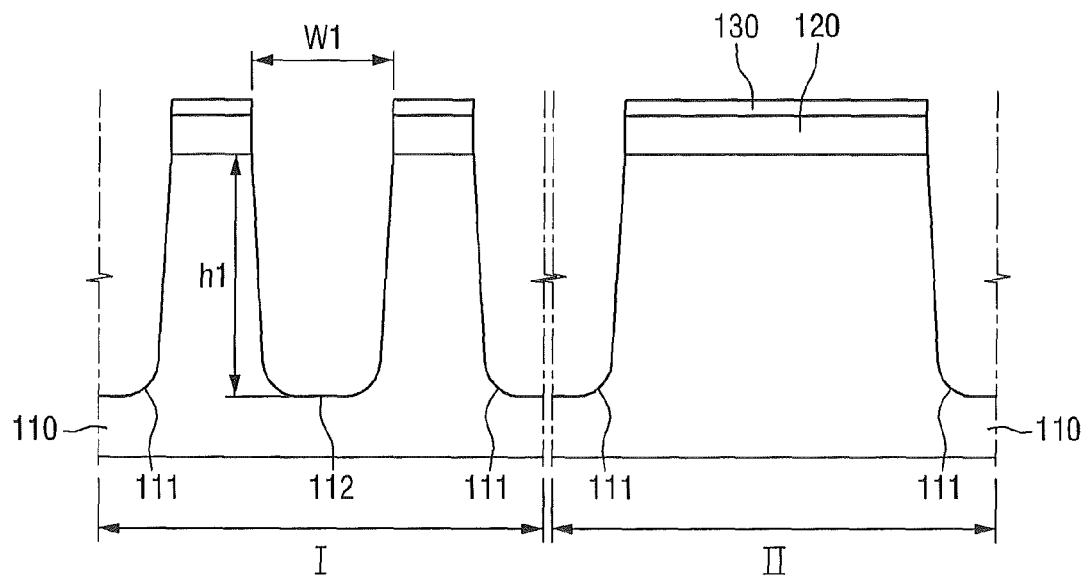

Next, referring to FIG. 4, the first mask film 120 and the reflection preventing film 130 are patterned to form a first mask pattern 120 and a reflection preventing pattern 130. The first mask pattern 120 and the reflection preventing pattern 130 may be formed using, for example, a photoresist pattern or a hard mask. The first mask pattern 120 and the reflection preventing pattern 130 define potential device isolation regions on the substrate 110.

Subsequently, trenches 111 and 112 for device isolation regions are formed using the first mask pattern 120 and the reflection preventing pattern 130 as etch masks. The trenches 111 and 112 for device isolation regions include a trench 111 for a first device isolation region defining a first region I and a second region II and a trench 112 for a second device isolation region formed between the trench 111 for a pair of first device isolation regions in the first region I. The trench 112 for the second device isolation region has a first width w1 and a first depth h1.

Next, the photoresist pattern or the hard mask remaining on the reflection preventing pattern 130 is removed to expose a top surface of the reflection preventing pattern 130.

Next, referring to FIG. 5, the trench 111 for the first device isolation regions and the trench 112 for the second device isolation region are filled with an insulating layer 140. The insulating layer 140 is formed on the substrate 110 and the reflection preventing pattern 130 to fill internal spaces of the trenches 111 and 112. The insulating layer 140 may be formed using, for example, a shallow trench isolation (STI) oxide or a field oxide (FOX) oxide.

Figure 6:
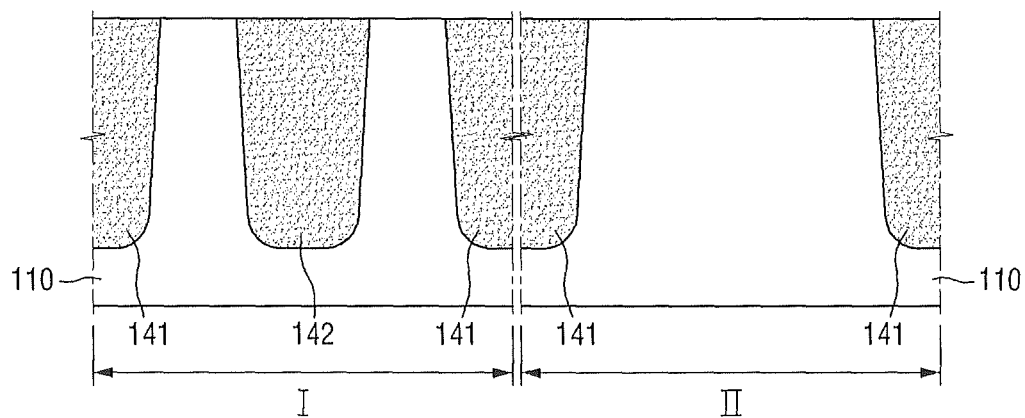

Referring to FIG. 6, the insulating layer 140, the reflection preventing pattern 130 and the first mask pattern 120 are removed until the top surface of the substrate 110 is exposed. The insulating layer 140, the reflection preventing pattern 130 and the first mask pattern 120 may be removed by, for example, a chemical mechanical planarization (CMP) process. Accordingly, a first device isolation region 141 and a second device isolation region 142 are formed, the first device isolation region 141 filled with the insulating layer 140 in the trench 111 for the first device isolation regions and the second device isolation region 142 filled with the insulating layer 140 in the trench 112 for the second device isolation region.

Figure 7:
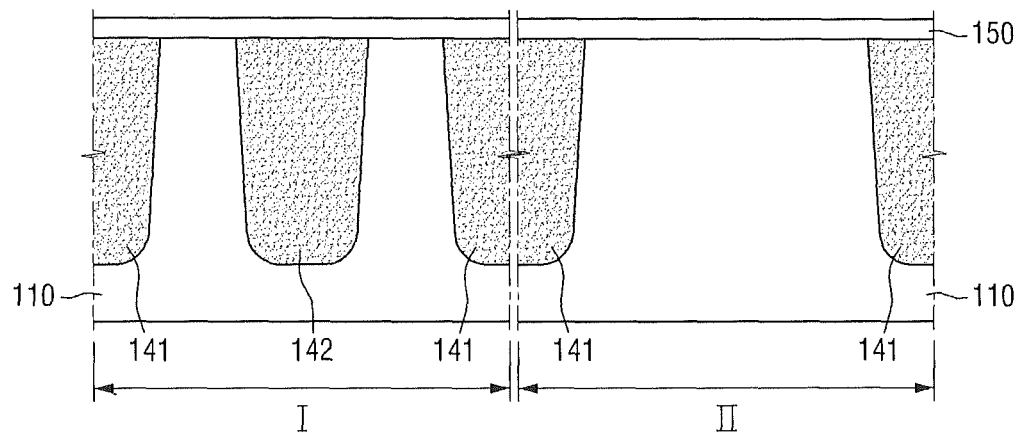

Next, referring to FIG. 7, a second mask film 150 is formed on the substrate 110 and on top surfaces of the device isolation regions 141 and 142. The second mask film 150 may include, for example, at least one nitride selected from the group consisting of SiN, SiON, TaN and TiN. The second mask film 150 may be formed by, for example, CVD, PECVD, PVD, ALD, or PEALD.

Figure 8:
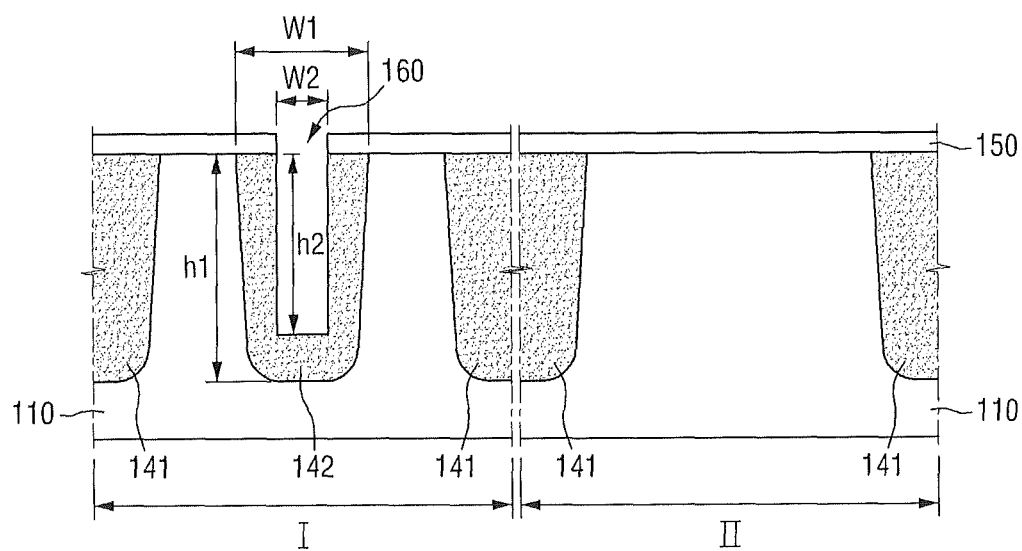
Figure 9:
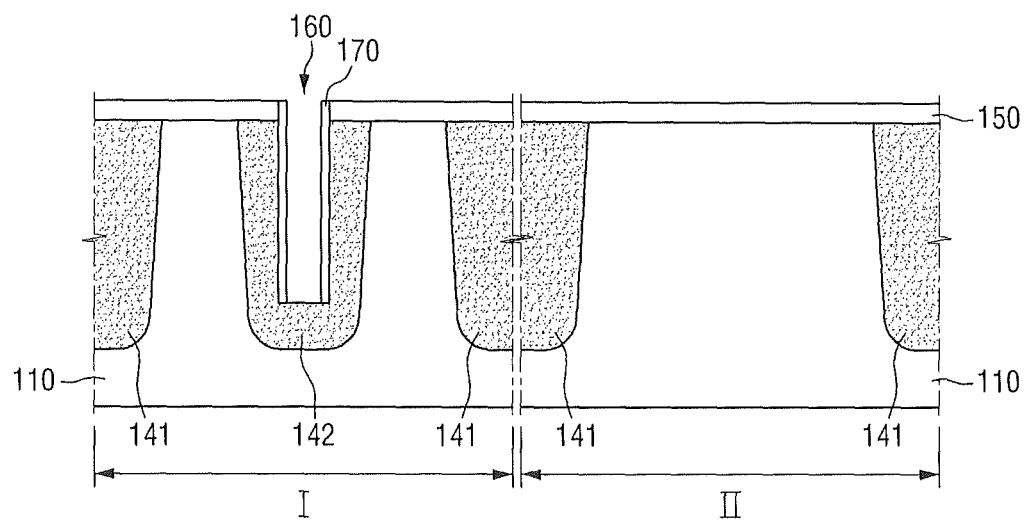

Referring to FIG. 8, the second mask film 150 is patterned to form a second mask pattern 150. The second mask pattern 150 may be formed using, for example, a photoresist pattern or a hard mask. The second mask pattern 150 defines a potential region of a recess trench 160 in the second device isolation region 142.

Subsequently, the exposed surface of the second device isolation region 142 is etched using the second mask pattern 150 as an etch mask to form the recess trench 160. The recess trench 160 has a second width w2 and a second depth h2. Here, the second width w2 is smaller than the first width w1 of the second device isolation region 142 and the second depth h2 is smaller than the first depth h1 of the second device isolation region 142. The recess trench 160 may be formed by, for example, plasma dry etching.

Next, the photoresist pattern or the hard mask remaining on the second mask pattern 150 is removed to expose a top surface of the second mask pattern 150.

Figure 10:
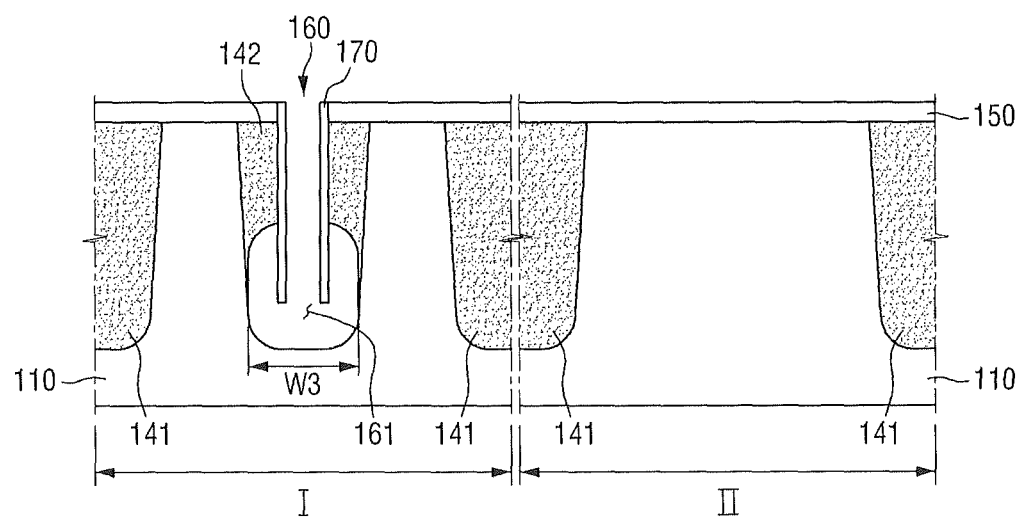

Next, referring to FIG. 10, the exposed surface of the second device isolation region 142 is etched using the second mask pattern 150 and the third mask pattern 170 as etch masks to form a recess ball 161 connected to the recess trench 160. The recess ball 161 is formed to penetrate the second device isolation region 142. The recess ball 161 has a third width w3. Here, the third width w3 is greater than the second width w2 of the recess trench 160.

The recess ball 161 may be formed by, for example, wet etching. In order to form the recess ball 161, an etching solution containing fluorine (F), for example, diluted HF (DHF), NH4F, or a combination thereof, may be used.

The second mask pattern 150 and the third mask pattern 170 are not etched because of their high etch selectivity with respect to the second device isolation region 142. Since isotropic wet etching is performed, some of the second device isolation region 142 that is not protected by the third mask pattern 170 is removed, and a lower space of the recess trench 160 is vertically and horizontally extended by the recess ball 161. Accordingly, the overall depth of the recess trench 160 and the recess ball 161 is the same as the depth h1 of the second device isolation region 142. In addition, a lower portion of the third mask pattern 170 protrudes inwardly with respect to the recess ball 161. Here, it is understood that when the third mask pattern 170 is referred to as protruding inwardly with respect to the recess ball 161, the lower portion of the third mask pattern 170 is formed to extend to be lower than a boundary between the recess trench 160 and the recess ball 161.

Subsequently, the second mask pattern 150 and the third mask pattern 170 are made to remain without being removed.

Figure 11:
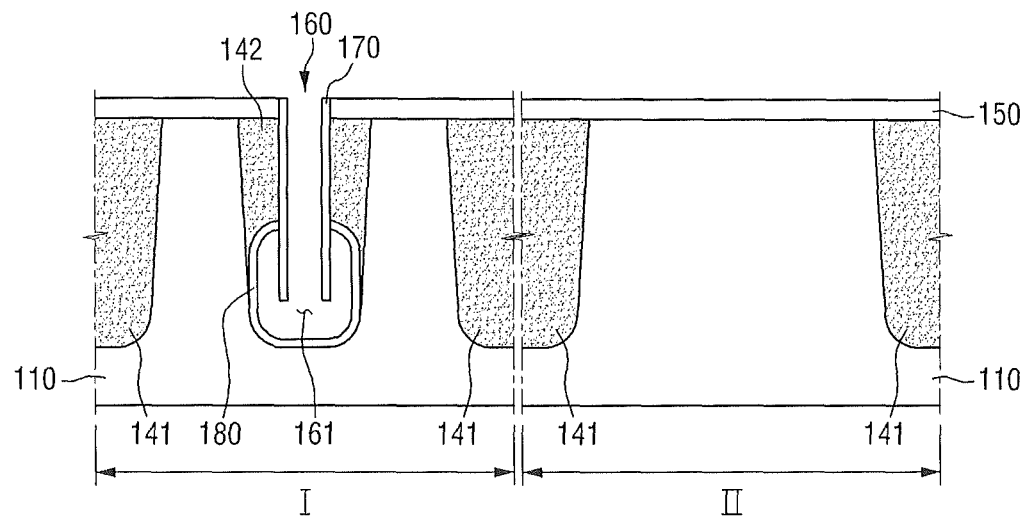

Next, referring to FIG. 11, a first gate insulating film 180 is formed along sidewalls and bottom surface of the recess ball 161 using the second mask pattern 150 and the third mask pattern 170 as thermal oxidation masks. The first gate insulating film 180 may include, for example, a silicon oxide film, SiON, GexOyNz, GexSiyOz, a high-k insulation film, and a combination thereof or a stacked film having these materials sequentially stacked. A thickness of the first gate insulating film 180 may be adjusted in consideration of electrical characteristics of a recess channel transistor.

The first gate insulating film 180 may be formed by performing, for example, a thermal oxidation process. In the thermal oxidation process, the second mask pattern 150 remaining on the substrate 110 allows the first gate insulating film 180 to be formed only on the sidewalls of the recess ball 161, while preventing an insulating film from being formed in the other area of the substrate 110, thereby reducing stress applied to the second region II of the substrate 110. In addition, since a separate etching process for removing the second mask pattern 150 is not necessary, the process steps of fabricating the semiconductor device is reduced, thereby simplifying overall fabricating process of the semiconductor device.

If the second mask pattern 150 is not made to remain but is removed, after forming the first gate insulating film 180, the insulating film is removed from the other region of the substrate 110, excluding the recess ball 161, and an insulating film is additionally formed in the second region II of the substrate 110. Thus, stress may be applied to the second region II of the substrate 110 and the process steps of fabricating the semiconductor device are increased, thereby increasing the complexity in the overall fabricating process of the semiconductor device.

Figure 12:
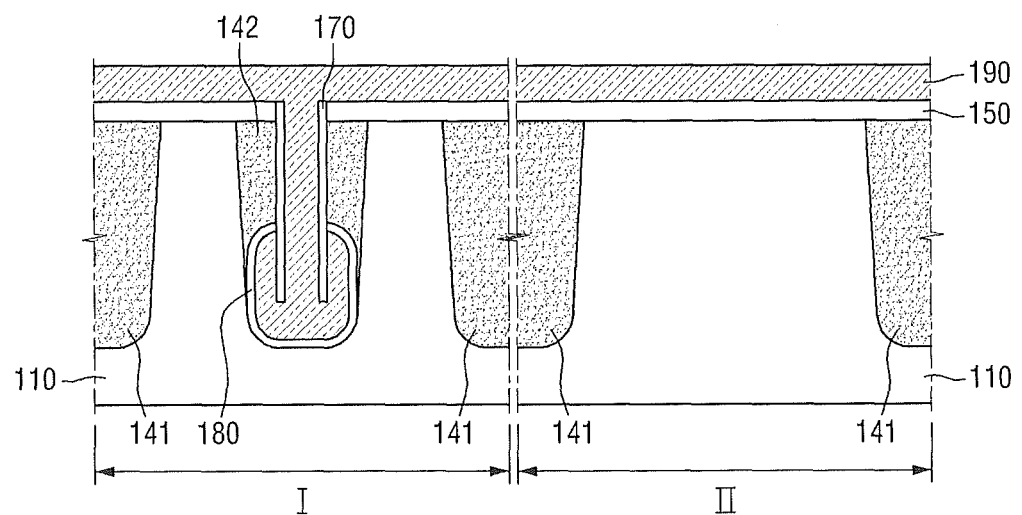

Next, referring to FIG. 12, the recess trench 160 and at least a portion of the recess ball 161 are filled with the first conductive layer 190. In more detail, the first conductive layer 190 is formed on the second mask pattern 150, the third mask pattern 170 and the first gate insulating film 180 to fill internal spaces of the recess trench 160 and the recess ball 161. The first conductive layer 190 may be made of, for example, polysilicon, or may be formed by stacking polysilicon, tungsten (W) and a metal.

Figure 13:
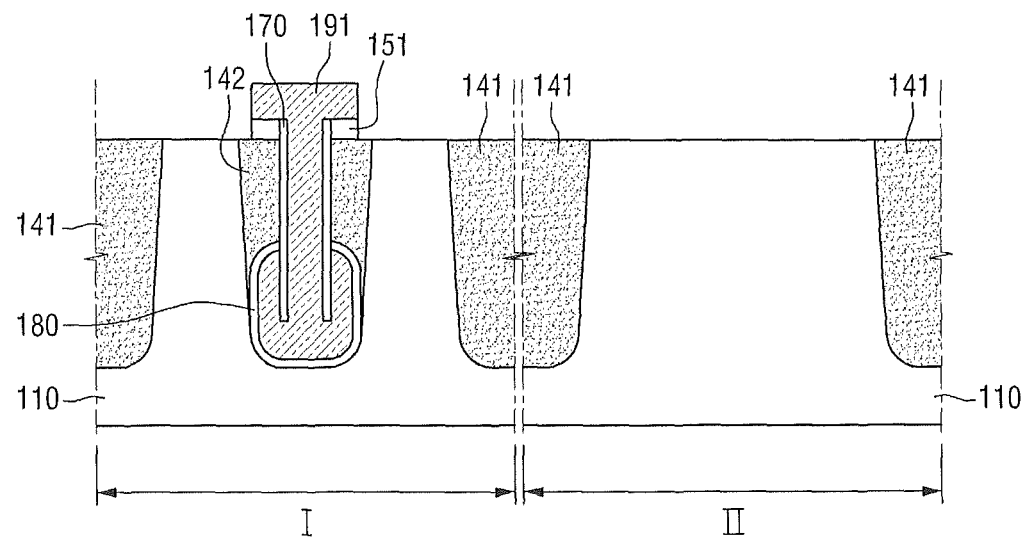

Next, referring to FIG. 13, the first conductive layer 190 and the second mask pattern 150 are patterned to form a first gate electrode 191. The first gate electrode 191 may be formed using, for example, a photoresist pattern or a hard mask. A sidewall profile of the second mask pattern 151 remaining in the first region I and a sidewall profile of the first gate electrode 191 are connected to each other.

Figure 14:
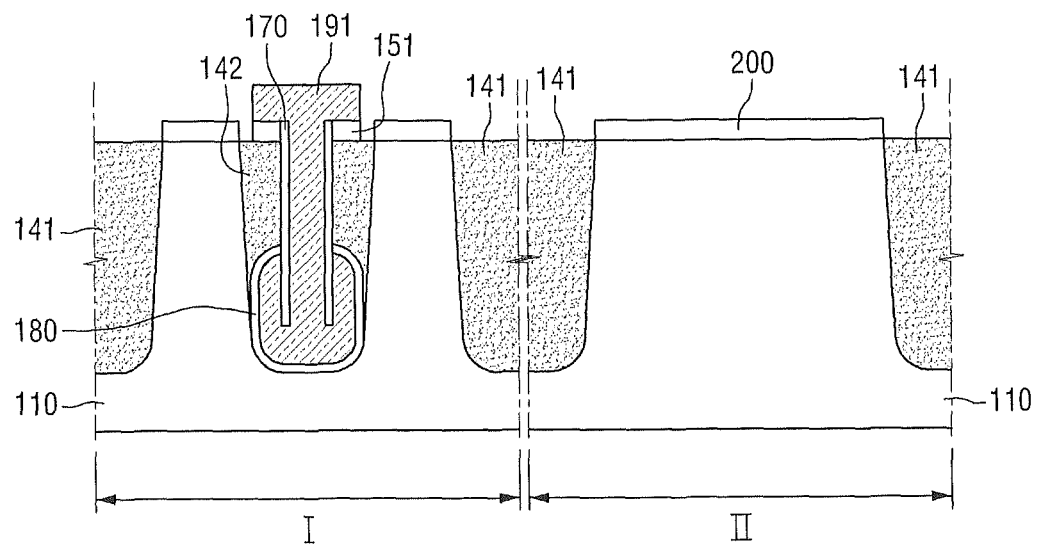

Next, referring to FIG. 14, an insulating film 200 is formed on a top surface of the second region II of the substrate 110. The insulating film 200 may include, for example, a silicon oxide film, SiON, GexOyNz, GexSiyOz, a high-k insulation film, and a combination thereof or a stacked film having these materials sequentially stacked. The insulating film 200 may have a thickness of, for example, 70 Å.

The insulating film 200 may be formed by performing, for example, a thermal oxidation process. In the thermal oxidation process, the insulating film 200 may also be formed on a top surface of the first region I of the substrate 110. In addition, a relatively thin insulating film (not shown) may also be formed on a surface of the first gate electrode 191.

Figure 15:
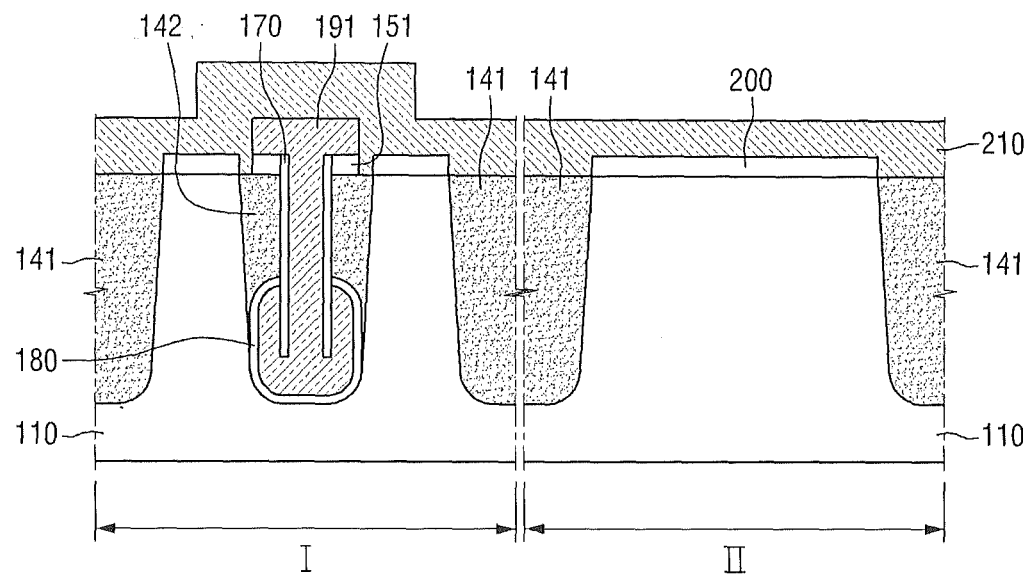

Next, referring to FIG. 15, a second conductive layer 210 is formed on the device isolation regions 141 and 142, the first gate electrode 191 and the insulating film 200. The second conductive layer 210 may be made of, for example, polysilicon, or may be formed by stacking polysilicon, tungsten (W) and a metal.

Next, referring again to FIG. 2, the second conductive layer 210 and the insulating film 200 are patterned to form a second gate electrode 211 and a second gate insulating film 201. The second gate electrode 211 and the second gate insulating film 201 may be formed using, for example, a photoresist pattern or a hard mask.

In such embodiments, the first gate electrode 191 may be made of the same material as the second conductive layer 210, but is not etched by a relatively thin insulating film formed on a surface of the first gate electrode 191.

Subsequently, impurity regions 221 and 222 are formed at both sides of the first gate electrode 191 and the second gate electrode 211 on the substrate 110. A distance between the bottommost portion of the impurity region 221 in the first region I and the boundary of the first gate insulating film 180 may be adjusted in consideration of electrical characteristics of a recess channel transistor. A depth of the impurity region 222 in the second region II may be adjusted in consideration of electrical characteristics of a planar channel transistor. The impurity regions 221 and 222 may be formed using ion implantation, which may be performed multiple times according to necessity.

Figure 16:
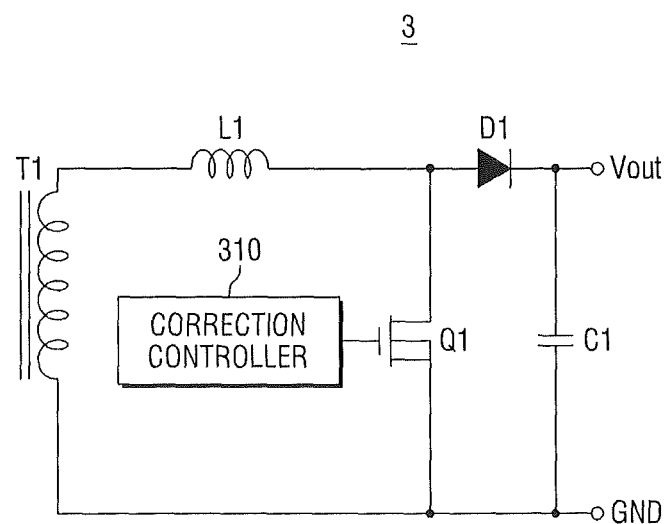
FIG. 16 is a schematic circuit view of an exemplary semiconductor system including a semiconductor device according to various embodiments of the present invention.

FIG. 16 is a schematic circuit view of an exemplary semiconductor system including a semiconductor device according to some embodiments of the present invention. Here, the semiconductor system may be a power supply device.

Referring to FIG. 16, the semiconductor system 3 may include a transformer T1, a choke coil L1, a rectifying diode D1, a smoothing condenser C1, a switching transistor Q1, and a correction controller 310.

The choke coil L1 is connected to a secondary winding of the transformer T1 to compensate for distortion, such as current overlapping. The switching transistor Q1 switches a voltage flowing through the choke coil L1 to be output to an output terminal. The correction controller 310 supplies the switching transistor Q1 with a control signal, thereby turning on/off the switching transistor Q1. The rectifying diode D1 rectifies the voltage transferred through the choke coil L1. The smoothing condenser C1 smoothes the voltage rectified by the rectifying diode D1 and outputs the smoothed voltage.

Here, the correction controller 310 may switch the switching transistor Q1 faster than the frequency of an input voltage and may adjust the operating time of the switching transistor Q1 to be proportional to the magnitude of the input voltage. In such a manner, the amount of current flowing in the choke coil L1 is controlled according to the switching cycle of the correction controller 310, thereby compensating for a power factor.

Meanwhile, at least one of the semiconductor devices according to some embodiments of the present invention shown in FIGS. 1 and 2 may be used as the switching transistor Q1.

Semiconductor devices described according to some embodiments of the present invention shown in FIGS. 1 and 2 are used in power supply devices, but aspects of the present invention are not limited thereto.

Figure 17:
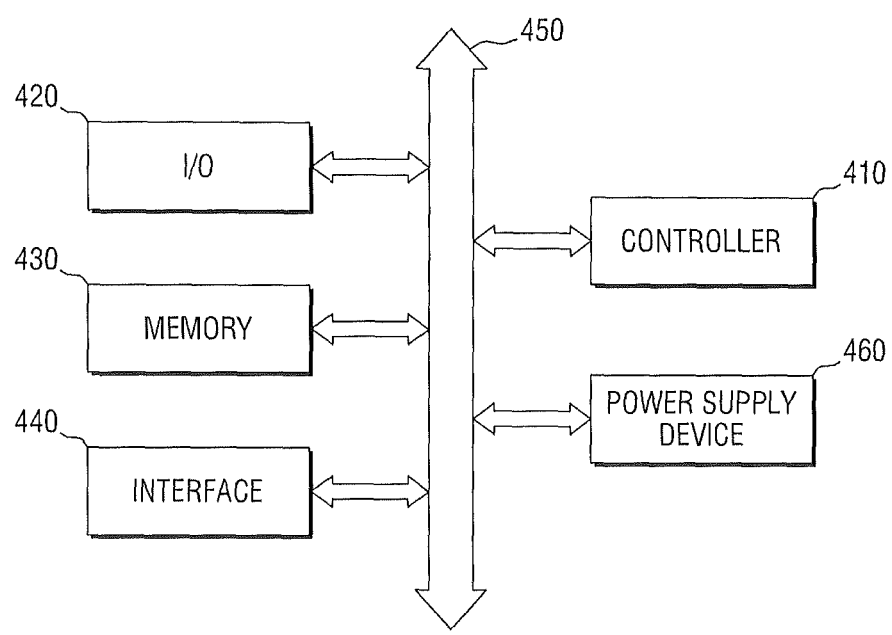
FIG. 17 is a schematic block diagram of an exemplary electronic system including a semiconductor system according to various embodiments of the present invention.

FIG. 17 is a schematic block diagram of an exemplary electronic system including a semiconductor system according to some embodiments of the present invention.

Referring to FIG. 17, the electronic system 4 may include a controller 410, an input/output device (I/O) 420, a memory 430, an interface 440, a power supply device 460 and a bus 450.

The controller 410, the I/O 420, the memory 430 and/or the interface 440 may be connected to each other through the bus 450. The bus 450 corresponds to a path along which data moves.

The controller 410 may include at least one of a microprocessor, a digital signal processor, a microcontroller, and logic devices capable of performing functions similar to those of these components.

The I/O 420 may include a keypad, a keyboard, a display, and so on.

The memory 430 may store data and/or commands.

The interface 440 may transmit data to a communication network or receive data from the communication network. The interface 440 may be wired or wireless. For example, the interface 440 may include an antenna or a wired/wireless transceiver.

The power supply device 460 converts externally input power and supplies the respective components 410, 420, 430 and 440 with the converted power. One or more of the power supply device 460 may be incorporated into the electronic system 4. The power supply device 460 may be a device shown in FIG. 14.

Although not shown, the electronic system 4 is an operating memory for improving the operation of the controller 410 and may further include a high-speed DRAM and/or SRAM.

The semiconductor system according to embodiments of the present invention may be provided into the memory 430 or may be provided as part of the controller 410 or the I/O 420.

The electronic system 4 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 18:
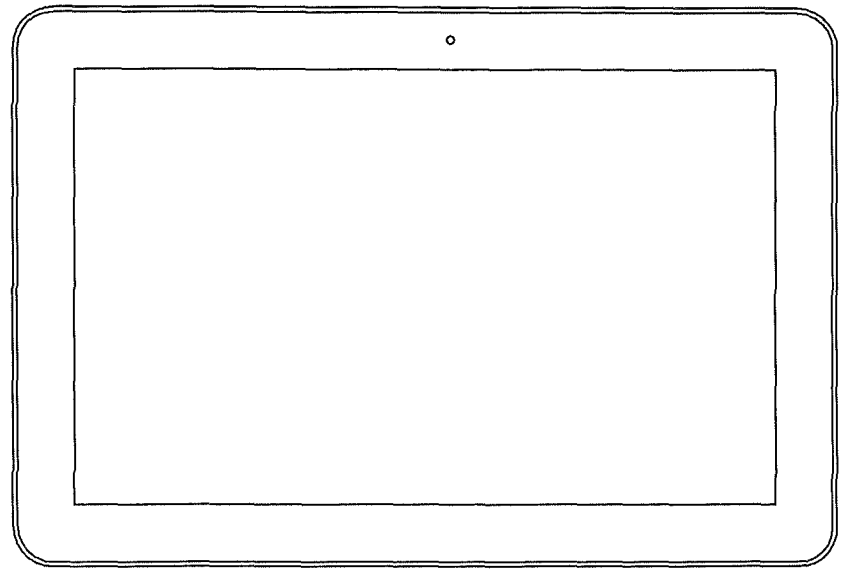
FIGS. 18 and 19 illustrate exemplary semiconductor systems to which a semiconductor device according to various embodiments of the present invention can be applied.
Figure 19:
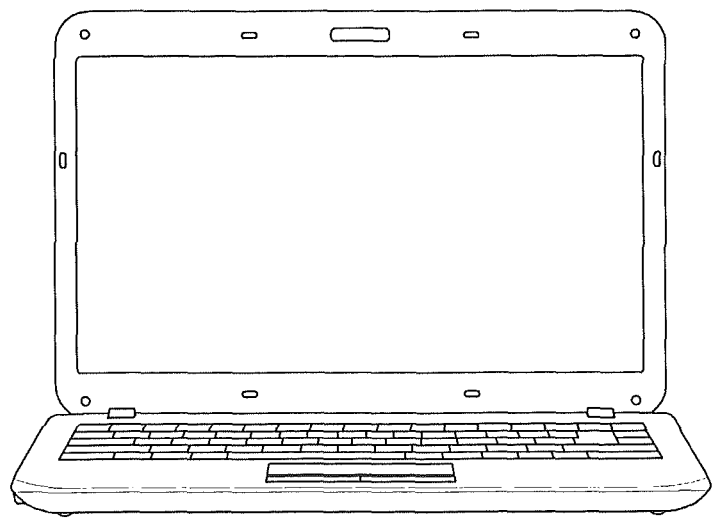

FIGS. 18 and 19 illustrate an exemplary semiconductor system to which the electronic system shown in FIG. 17 can be applied. Specifically, FIG. 18 illustrates a tablet PC and FIG. 19 illustrates a notebook computer. It is obvious to one skilled in the art that the semiconductor device according to some embodiments of the present invention can be applied to other integrated circuit devices not illustrated herein.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device, comprising;
   a device isolation region;
   a trench in the device isolation region;
   a void connected to the trench in the device isolation region;
   a first mask pattern along sidewalls of the trench and protruding into the void;
   a second mask pattern on a top surface of the device isolation region;
   a gate insulating film along the sidewall of the void; and
   a gate electrode filling the trench and at least a portion of the void,
      wherein the gate electrode is on the first mask pattern, the second mask pattern and the gate insulating film.

2. The semiconductor device of claim 1, wherein a sidewall profile of the gate electrode and a sidewall profile of the second mask pattern are connected to each other.

3. The semiconductor device of claim 1, wherein the void is penetrates the device isolation region.

4. The semiconductor device of claim 3, wherein a width of the void is greater than that of the trench.

5. The semiconductor device of claim 1, wherein the first mask pattern includes a nitride.

6. A semiconductor device, comprising:
   a device isolation region;
   a trench in the device isolation region;
   a void connected to the trench in the device isolation region;
   a first mask pattern along sidewalk of the trench, wherein a bottom portion of the first mask pattern extends into the void lower than a boundary between the trench and the void;
   a gate insulating film along the sidewall of the void; and
   a gate electrode filling the trench and at least a portion of the void.

7. The semiconductor device of claim 6, wherein the gate electrode filling at least: a portion of the void surrounds the bottom portion of the first mask pattern on three sides.

8. The semiconductor device of claim 6, further comprising a second mask pattern on a top surface of the device isolation region.

9. The semiconductor device of claim 8, wherein a sidewall profile of the gate electrode and a sidewall profile of the second mask pattern are connected to each other.

10. The semiconductor device of claim 8, wherein the gate electrode is on the first mask pattern, the second mask pattern and the gate insulating film.

\* \* \* \* \*